United States Patent
Patel et al.

(10) Patent No.: US 12,260,919 B2
(45) Date of Patent: *Mar. 25, 2025

(54) SYSTEMS AND METHODS INVOLVING HARDWARE-BASED RESET OF UNRESPONSIVE MEMORY DEVICES

(71) Applicant: Micron Technology, Inc., Boise, ID (US)

(72) Inventors: Vipul Patel, Santa Clara, CA (US); Theodore Pekny, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/845,785

(22) Filed: Jun. 21, 2022

(65) Prior Publication Data

US 2022/0319612 A1    Oct. 6, 2022

Related U.S. Application Data

(63) Continuation of application No. 17/188,153, filed on Mar. 1, 2021, now Pat. No. 11,386,964, which is a continuation of application No. 16/543,271, filed on Aug. 16, 2019, now Pat. No. 10,937,506.

(51) Int. Cl.
| | |
|---|---|
| *G11C 16/22* | (2006.01) |
| *G11C 16/10* | (2006.01) |
| *G11C 16/14* | (2006.01) |
| *G11C 16/26* | (2006.01) |
| *G11C 16/30* | (2006.01) |
| *G11C 16/32* | (2006.01) |

(52) U.S. Cl.
CPC .............. *G11C 16/22* (2013.01); *G11C 16/10* (2013.01); *G11C 16/14* (2013.01); *G11C 16/26* (2013.01); *G11C 16/30* (2013.01); *G11C 16/32* (2013.01)

(58) Field of Classification Search
CPC ......... G11C 16/32; G11C 16/30; G11C 16/26; G11C 16/14; G11C 16/10; G11C 16/22
USPC ....................................................... 365/185.29
See application file for complete search history.

(56) References Cited

U.S. PATENT DOCUMENTS

| | | |
|---|---|---|
| 6,697,907 B1 | 2/2004 | Roohparvar |
| 9,959,052 B1 | 5/2018 | Xu et al. |
| 10,539,989 B1 * | 1/2020 | Pedersen ............... G06F 1/3206 |
| 10,937,506 B1 | 3/2021 | Patel et al. |
| 11,386,964 B2 | 7/2022 | Patel et al. |

(Continued)

OTHER PUBLICATIONS

International Search Report and Written Opinion, PCT/US2020/045779, mailed on Nov. 11, 2020.

*Primary Examiner* — Sung Il Cho
(74) *Attorney, Agent, or Firm* — Greenberg Traurig

(57) ABSTRACT

Systems and methods of memory operation that provide a hardware-based reset of an unresponsive memory device are disclosed. In one embodiment, an exemplary system may comprise a semiconductor memory device having a memory array, a controller that may include a firmware component for controlling memory operations, and a reset circuit including power-up circuitry and timeout circuitry. The reset circuit may be configured to detect when the memory device is in a non-responsive state and reset the memory device without using any internal controller components potentially impacted/affected by the non-responsive state.

20 Claims, 4 Drawing Sheets

(56) References Cited

U.S. PATENT DOCUMENTS

| | | | |
|---|---|---|---|
| 2009/0094421 A1* | 4/2009 | Lewis | G06F 21/78 |
| | | | 711/E12.091 |
| 2011/0264851 A1* | 10/2011 | Jeon | G11C 16/10 |
| | | | 711/E12.069 |
| 2012/0099392 A1 | 4/2012 | Shim et al. | |
| 2012/0221766 A1* | 8/2012 | Yeh | G06F 12/0246 |
| | | | 711/E12.008 |
| 2014/0026232 A1 | 1/2014 | Lee et al. | |
| 2014/0307517 A1 | 10/2014 | Jang | |
| 2020/0065011 A1* | 2/2020 | Lee | G11C 16/22 |
| 2021/0050063 A1 | 2/2021 | Patel et al. | |
| 2021/0183451 A1 | 6/2021 | Patel et al. | |

* cited by examiner

SYSTEMS AND METHODS INVOLVING HARDWARE-BASED RESET OF UNRESPONSIVE MEMORY DEVICES

RELATED APPLICATION

The present application is a continuation application of U.S. patent application Ser. No. 17/188,153, filed Mar. 1, 2021, which is a continuation application of U.S. patent application Ser. No. 16/543,271, filed Aug. 16, 2019, issued as U.S. Pat. No. 10,937,506 on Mar. 2, 2021, and entitled "SYSTEMS AND METHODS INVOLVING HARDWARE-BASED RESET OF UNRESPONSIVE MEMORY DEVICES," the disclosure of which application is hereby incorporated by reference herein in its entirety.

TECHNICAL FIELD

The present disclosure relates generally to semiconductor memory, and more particularly, to systems and methods for implementing a hardware-based reset of memory devices that have become unresponsive.

BACKGROUND

Integrated circuit devices traverse a broad range of electronic devices including memory devices, which are often referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

NAND flash memory is a common type of flash memory, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor.

Further, current NAND memory devices provide various methods to reset the memory if it becomes unresponsive. Certain commands may be used to reset an entire memory device, for example, but such commands are often processed via memory control circuitry and/or firmware controllers that are also used in the memory operations. Other techniques are provided to reset erase or program operations, as opposed to the overall memory device, yet such techniques also typically require internal control circuitry and/or firmware. These techniques are not useful if the control circuitry and/or firmware controllers that process the reset instructions also become unresponsive, which can occur with brownout, illegal sequences, etc. As such, users may have no recourse when memory devices become unresponsive in this manner, as powering-down in not an option in actual systems and operation. Updating memory design to avoid such drawbacks is also a challenge, as the addition of another, dedicated pin to perform such reset independent of the control circuitry and firmware is also not viable, due to the cost and complexity of adding an extra pin to the package.

The disclosed embodiments provide improved technical solutions regarding the above-noted drawbacks and/or otherwise remedy or overcome the above and other deficiencies of existing semiconductor memories.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

Figure 1:
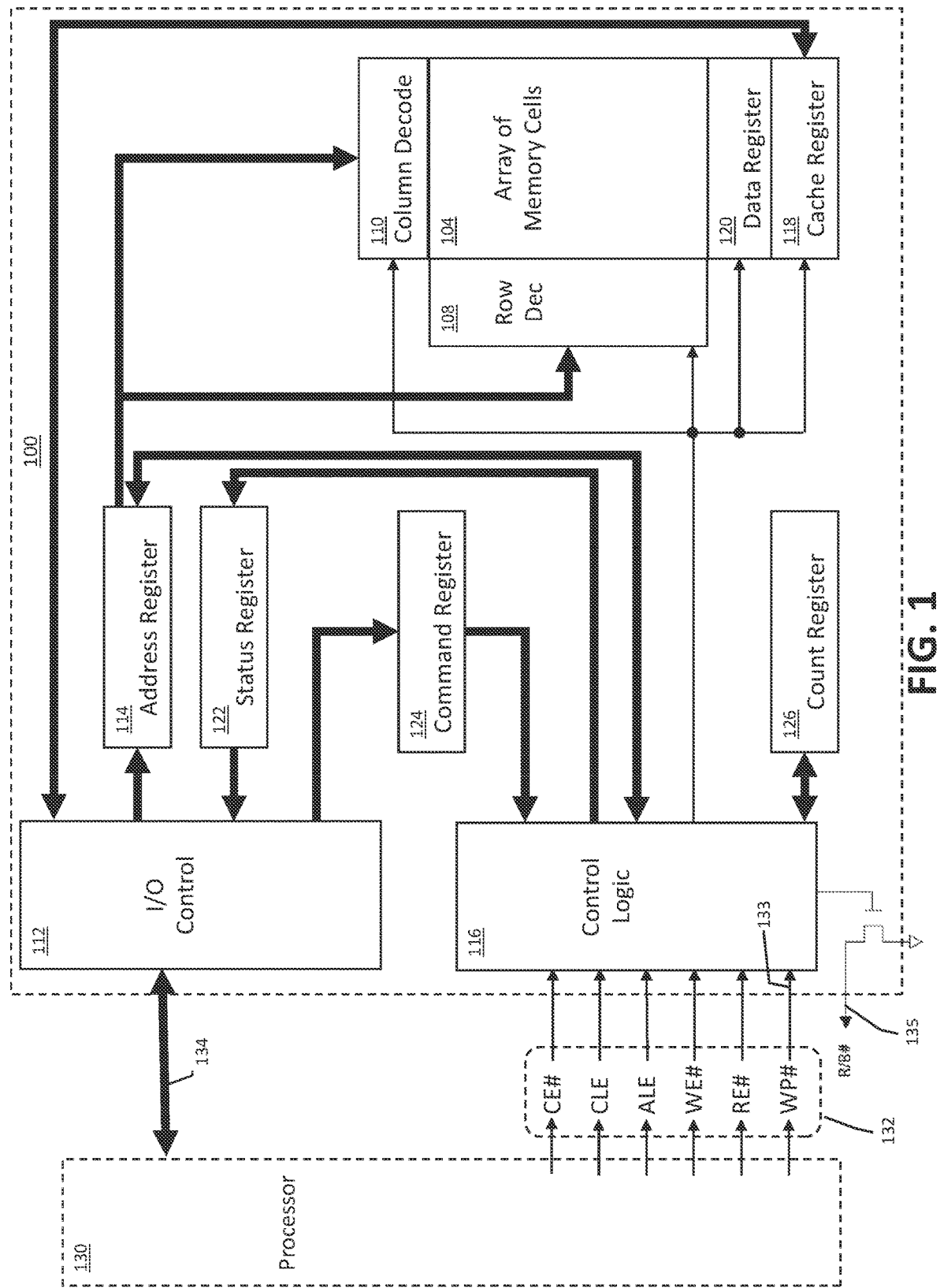
FIG. 1 is a simplified block diagram of a memory device in communication with a processor, according to some embodiments of the disclosure.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

Various embodiments will be discussed using the example of a NAND memory device. However, it should be understood that the concepts disclosed herein may also be applied to other forms of semiconductor memory.

As explained in more detail, below, systems and methods of memory operation that provide a hardware-based reset of an unresponsive memory device are provided. In one embodiment, an exemplary system may comprise a semiconductor memory device having a memory array, a controller that may include a firmware component for controlling memory operations, as well as reset circuitry including a special timeout circuit. The reset circuitry may be configured to detect when the memory device is in a non-responsive state and reset the memory device without using any internal controller components potentially impacted/affected by the non-responsive state. The timeout circuit may be configured with a timeout delay value based on parameters and conditions of the particular memory device. Once enabled, the timeout circuit can reset an entire memory device without requiring any of the internal memory control circuitry or firmware controllers of the memory, i.e., the components that may be or could become unresponsive, to process the relevant reset instructions.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A count register 126 may be in communication with the control logic 116 to store count data, such as data representative of respective numbers of read cycles for different portions of the array of memory cells 104. Although depicted as a separate storage register, count register 126 may represent a portion of the array of memory cells 104.

A controller (e.g., the control logic 116 internal to the memory device 100) controls access to the array of memory cells 104 in response to the commands and generates status information for the external processor 130, i.e., control logic 116 is configured to perform access operations (e.g., read operations, program operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #133. Memory device 100 may also generate output signals, such as ready/busy R/B #135. Control signals and output signals may be applied to or present on specified pins of the memory package, as shown further in connection with FIG. 2, below. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of I/O bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations, numbers and/or specific ones of I/O pins may be used in the various embodiments.

Figure 2:
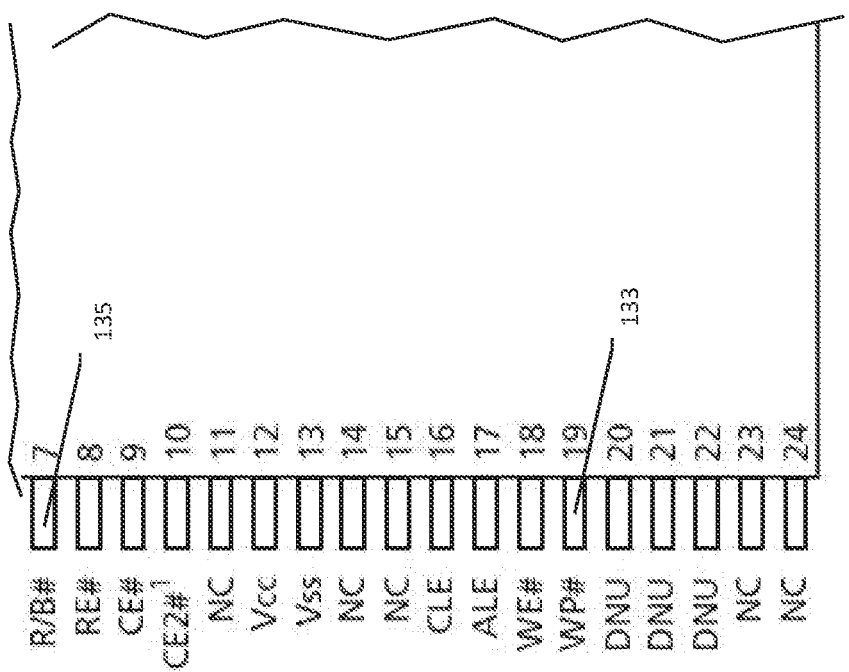
FIG. 2 is a simplified diagram showing an exemplary memory device package and associated pin assignment, according to some embodiments of the disclosure.

FIG. 2 is a simplified diagram showing an exemplary memory device package and associated pin assignment, according to some embodiments of the disclosure. Referring to FIG. 2, a top view of an exemplary pin assignment for a memory device package, illustrating some input and output pins of a memory device, is shown. For example, the pin assignment of FIG. 2 shows pins for Vcc, Vss, CLE (command latch enable), ALE (address latch enable), WE #(write enable), WP #(write protect) 133, R/B #(ready/busy) 135, as well as various NC (no care), DNU (do not use), and other pins. As described in more detail, below, embodiments herein may repurpose the write protect WP #pin to provide a mechanism for the overall memory device to be reset, i.e., if the entire device becomes unresponsive. Further, some embodiments may utilize a time duration of a low signal on the ready/busy output or pin in calculating a timeout delay value that a timeout circuit uses to reset the memory device.

Figure 3:
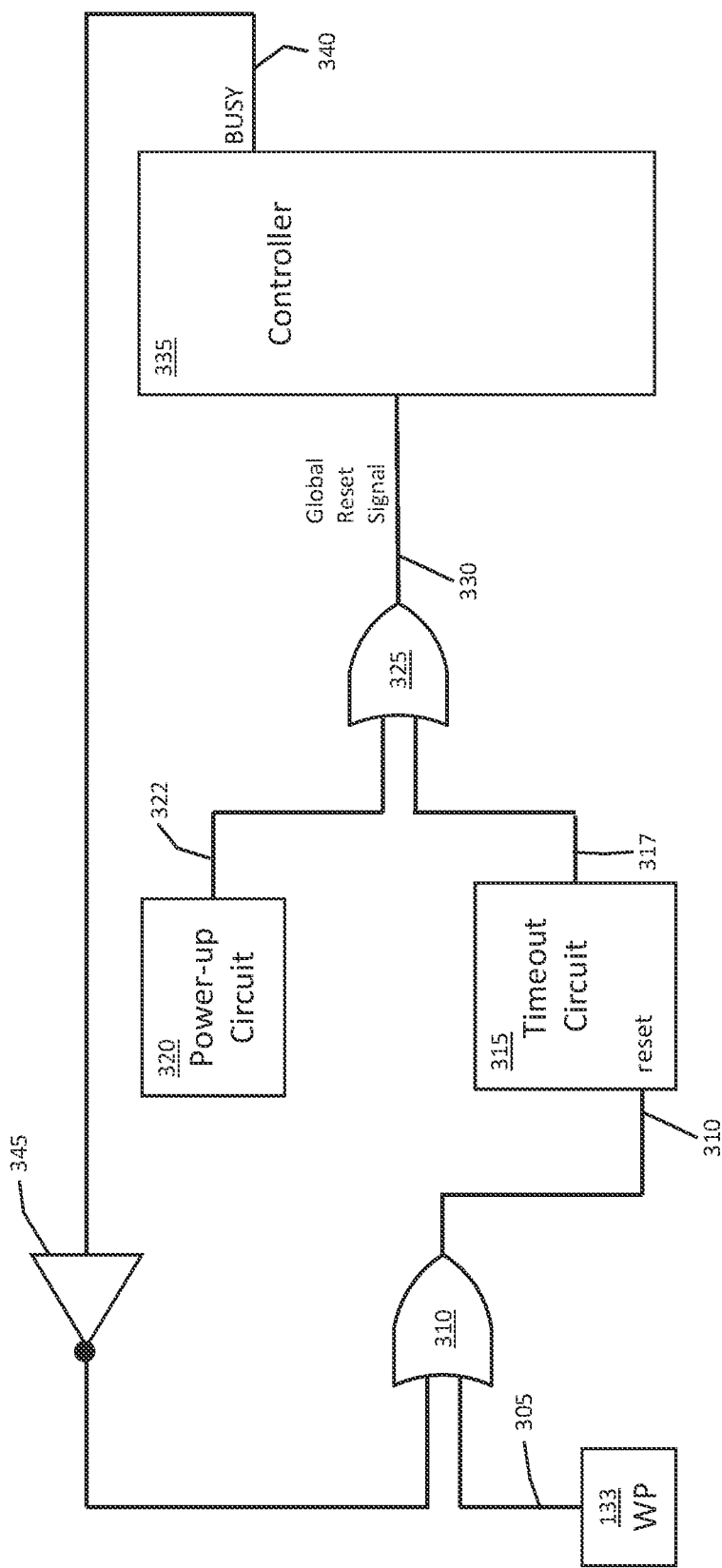
FIG. 3 is a block diagram illustrating an exemplary reset and memory control circuitry, according to some embodiments of the disclosure.

FIG. 3 is a block diagram illustrating an exemplary reset and memory control circuitry, according to some embodiments of the disclosure. The illustrative circuitry of FIG. 3 involved in embodiments of the disclosed technology may include a first logic circuit 310, a timeout circuit 315, a power-up circuit, a second logic circuit, and a controller 335, which may be control circuity, control logic 116, a firmware controller, and the like. Referring to FIG. 3, the signals being processed may include a write protect signal 305 coming from the write protect pin 133, a (reset) input of the timeout circuit 310, and output 317 of the timeout circuit 315, an output 322 of the power-up circuit 320, an output (global reset signal 330), which may be low (e.g. Lowvcc) or high (e.g. Vcc), of the second logic circuit 325, and an output of the controller, which may be a busy signal 340 such as ready/busy signal RB #, of the controller 335.

Referring to the example embodiment shown in FIG. 3, the busy signal 340 being provided as output from the controller 335 is fed back in a loop to be provided along with the write protect signal 305 as part of the control signals used to enable the timeout circuit via its reset input 310. Here, the timeout circuit 315 may be enabled, e.g. via first logic circuit 310, when the write protect is kept low and the busy signal 340 is also high, indicating that that the memory device is unresponsive. Such logic may be implanted using an OR gate, as shown, though various other logic may be utilized. This example implementation is further beneficial in that it allows continued use of the write protect WP #pin and functionality for its original purpose, which will not trigger the hardware reset disclosed herein. Here, for example, the normal aborting of program and erase operations will cause the busy signal 340 to switch back to a low state and reset the timeout circuit 315. In contrast, the special hardware reset herein only occurs if the memory device is still not responsive (i.e., busy signal 340 is high) after the write protect 305 is kept low and the busy signal 340 is maintained high beyond the duration of the full timeout delay value or 'fixed delay' calculated for use by the timeout circuit 315.

In some embodiments, the timeout delay value may be calculated based on the greater of (i) the necessary time that the write protect signal is held low to reset erase/program operations, i.e., when the memory becomes unresponsive during erase or program, (ii) the worst-case time that is desired for the busy signal to be high, i.e., the worst-case time for the memory device to be busy, indicating it is in an unresponsive state. With regard to the first time, (i), implementations herein may determine, for the memory device, this first time that a write protect signal is held low during an erase operation or a program operation to perform this reset. The time needed to perform such reset operation (often referred to as tRST) may be provided in the datasheet for a given memory device, e.g., as the tRST spec. Here, for example, if the memory device were to become unresponsive during erase or program, reset is performed by keeping the write protect signal active (e.g., low) for greater than this reset time, tRST, to see if the memory device's busy signal transitions from the busy or unresponsive state to the ready state. With regard to the second time, (ii), implementations herein may also set the timeout delay value equal to, or just above, a second time that the busy signal is held high, if such second time is greater than the first time, (i). Here, for example, this second time may be established by determining the worst-case busy high time for any memory operation of the memory device. Further, the reset circuitry may factor-in this second time with some margin added. As such, by comparing these two times and using the greater of the two, the timeout circuit is not triggered until after such worst-case time period has elapsed. Accordingly, then, if the write protect signal is held low for this entire, worst-case time delay value, the reset circuitry is configured to provide a reset signal to transition the control circuitry and/or memory device out of an unresponsive state. Operation involving such timeout delay value or fixed delay is shown and described further, below, in connection with FIG. 4. Additional conditions associated with the hardware reset herein may also be added as part of triggering the timeout delay. For example, the hardware reset may be conditioned on things such as the NAND failing initialization, the NAND failing certain number of program/erase operations, and the like.

Figure 4:
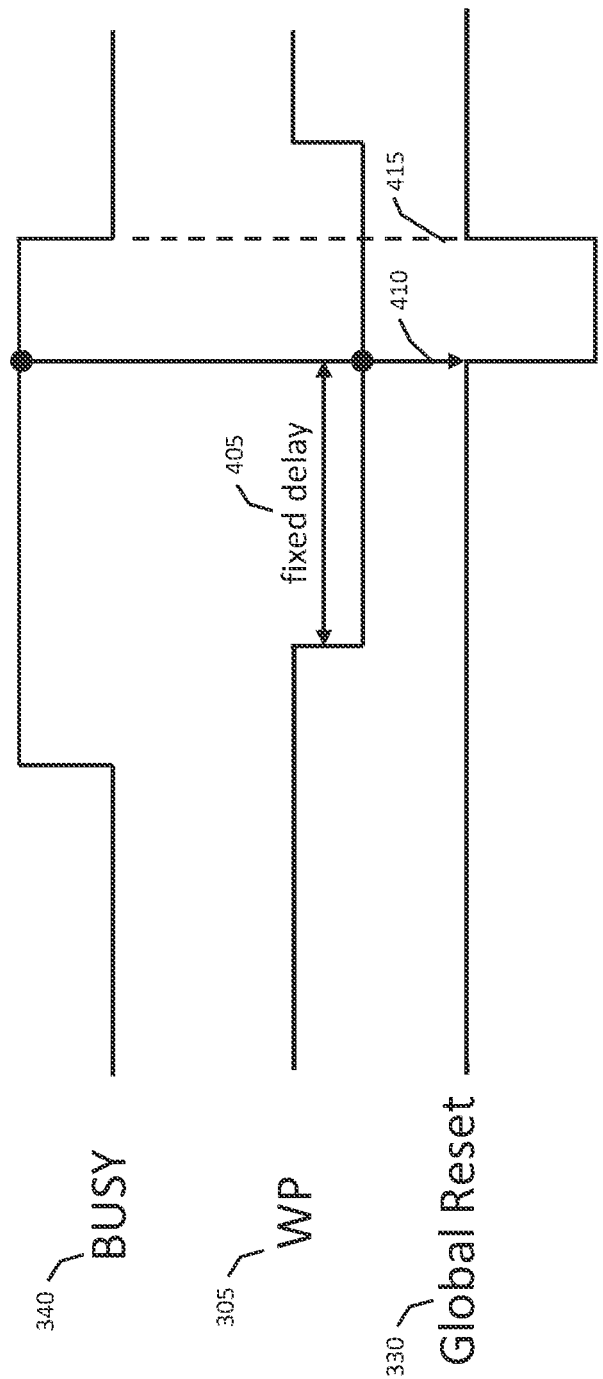
FIG. 4 is a generic wave diagram demonstrating timeout reset circuitry behavior and associated delay, according to some embodiments of the disclosure.

FIG. 4 is a generic wave diagram demonstrating timeout reset circuitry behavior and associated delay, according to some embodiments of the disclosure. Referring to FIG. 4, example waveforms corresponding to the busy signal 340, the write protect signal 305, and the global reset signal 330 set forth above in connection with FIG. 3. As shown in FIG. 4, the memory may first be operating normally with the global reset signal 330 in a high (Vcc) state and write protect 305 off (high), when the busy signal 340 goes high upon the memory device entering an unresponsive state. Thereafter, the write protect signal 305 may be transitioned to active (low), which may begin a customary period of application of such low signal for a period of time, tRST, sufficient to reset unresponsive erase or program operations. However, once the write protect signal 305 is maintained past both this initial reset attempt period, tRST, and the full period of fixed delay 405 (the 'timeout delay value'), a reset consistent with the disclosed technology may then be provided, e.g., to activate the global reset signal 330 provided to reset the memory. This resets the memory circuitry and memory device, yield a hardware-based timeout reset, at 410. Upon completion of the powering-down and associated reset of the memory circuitry, the global reset signal 330 to the memory circuitry is returned to high (Vcc) and the busy signal returns to the low (ready) state, at 415. As such, hardware reset herein may be configured to occur only when the memory device is still not responsive after the write protect is kept low and the ready/busy signal stays low beyond a duration of the timeout delay 405. Accordingly, embodiments herein may repurpose an existing circuit and pin, such as an existing write protect pin, and combine such use with the disclosed reset and timeout circuitry to provide the capability of resetting a non-responsive memory device without access or processing by circuit components that may be inactive (unresponsive) due to the non-responsive state of the memory device.

Furthermore, the subject matter disclosed above may be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Those skilled in the art will recognize that the methods and devices of the present disclosure may be implemented in many manners and as such are not to be limited by the foregoing exemplary embodiments and examples. In other words, aspects/elements can be performed by single or multiple components, in various combinations and/or sub-combinations, and individual aspects, may be distributed among components and/or subcomponents. In this regard, any number of the features of the different embodiments described herein may be combined into single or multiple embodiments, and alternate embodiments having fewer than, or more than, all the features described herein are possible.

While various embodiments have been described for purposes of this disclosure, such embodiments should not be deemed to limit the teaching of this disclosure to those embodiments. Various changes and modifications may be made to the elements and features described above to obtain a result that remains within the scope of the systems and processes described in this disclosure.

The invention claimed is:

1. A memory device comprising:
   a write protect pin; and
   a timeout circuit coupled to the write protect pin, the timeout circuit having an output that causes generation of a reset signal for resetting the memory device in response to determining that the timeout circuit has been activated for longer than a predetermined time duration while the memory device is in a busy state.

2. The memory device of claim 1, wherein the reset signal is provided to a controller to transition the memory device out of the busy state.

3. The memory device of claim 1, wherein the predetermined time duration is longer than an erase or program reset time duration of the memory device.

4. The memory device of claim 1, further comprising:
   a logic gate having an output that provides the reset signal, wherein the output of the timeout circuit is an input to the logic gate; and
   a power-up circuit configured to provide a power-up signal as an input to the logic gate in response to a power-up operation.

5. The memory device of claim 1, further comprising a controller configured to, in response to receiving the reset signal, power-down and then power-up again to reset the memory device.

6. The memory device of claim 1, wherein the predetermined time duration is greater than a time duration that a write protect signal from the write protect pin is maintained active to perform reset of an erase or program operation.

7. The memory device of claim 1, further comprising a controller and at least one memory array, wherein the at least one memory array, the controller, and the timeout circuit are contained within a semiconductor memory package, the package comprising the write protect pin.

8. The memory device of claim 1, further comprising a controller configured to indicate via a busy signal when the memory device is processing a program operation, processing an erase operation, or transferring data to a data register during a read operation.

9. The memory device of claim 1, further comprising a power-up circuit, wherein an output of the power-up circuit is a first input to a logic circuit, an output of the timeout circuit is a second input to the logic circuit, and an output of the logic circuit provides the reset signal to cause a power-down and then power-up of the memory device.

10. The memory device of claim 1, wherein the write protect pin is configured to receive a write protect signal from a processor external to the memory device.

11. A memory device comprising:
    a controller configured to control access to a memory and provide a busy signal;
    a write protect pin configured to receive a write protect signal; and a timeout circuit configured to activate in response to the busy signal and the write protect signal, and further configured to generate a reset signal in response to determining that the timeout circuit has been activated for longer than a predetermined time duration.

12. The memory device of claim 11, wherein the controller is powered-down and then powered-up in response to the reset signal.

13. The memory device of claim 11, wherein the timeout circuit is activated when the write protect signal is maintained in a logic state beyond a period of time for resetting an erase or program operation of the memory device.

14. The memory device of claim 11, further comprising device status circuitry configured to provide the busy signal as output on a ready/busy pin.

15. The memory device of claim 11, wherein the busy signal is generated to indicate when the memory device is busy or unresponsive.

16. The memory device of claim 11, further comprising a logic circuit that provides a reset input to the timeout circuit, wherein the logic circuit is configured to couple the write protect signal with the busy signal to generate the reset input.

17. A method comprising:
transitioning a busy signal to an active state corresponding to a memory device entering an unresponsive state;
while the busy signal is in the active state, transitioning a write protect signal to an active state; and
in response to the write protect signal being maintained in the active state for a period of fixed delay, activating a reset signal to reset the memory device.

18. The method of claim 17, further comprising:
in response to activating the reset signal, powering-down and resetting the memory device; and
after resetting the memory device, transitioning the reset signal to an inactive state, and transitioning the signal to an inactive state.

19. The method of claim 17, wherein the write protect signal is provided from a write protect pin of the memory device.

20. The method of claim 17, wherein the period of fixed delay is greater than a period of time sufficient to reset unresponsive erase or program operations of the memory device when the write protect signal is maintained in the first state.

* * * * *